US010867545B2

(12) United States Patent
Kirisken (10) Patent No.: US 10,867,545 B2
(45) Date of Patent: Dec. 15, 2020

(54) METHOD FOR A DISPLAY DEVICE (71) Applicant: VESTEL ELEKTRONIK SANAYI VE TICARET A.S., Manisa (TR)

(72) Inventor: Barbaros Kirisken, Manisa (TR)

(73) Assignee: VESTEL ELEKTRONIK SANAYI VE TICARET A.S., Manisa (TR)

( * ) Notice: Subject to any disclaimer, the term of this patent is extended or adjusted under 35 U.S.C. 154(b) by 0 days.

(21) Appl. No.: 16/474,947

(22) PCT Filed: Sep. 21, 2017

(86) PCT No.: PCT/EP2017/073908
§ 371 (c)(1),
(2) Date: Jun. 28, 2019

(87) PCT Pub. No.: WO2018/121893
PCT Pub. Date: Jul. 5, 2018

(65) Prior Publication Data
US 2019/0340970 A1     Nov. 7, 2019

(30) Foreign Application Priority Data
Dec. 28, 2016   (EP) .................................... 16206859

(51) Int. Cl.
*G09G 3/20*       (2006.01)
*G09G 3/32*       (2016.01)

(52) U.S. Cl.
CPC ............ *G09G 3/2003* (2013.01); *G09G 3/32* (2013.01); *G09G 2300/0452* (2013.01)

(58) Field of Classification Search
CPC ............... G09G 3/2003; G09G 3/32; G09G 2300/0452; G09G 2340/0457; G09G 3/20; H01L 27/15; H01L 27/32; H01L 25/0753
See application file for complete search history.

(56) References Cited

U.S. PATENT DOCUMENTS 6,198,467 B1 * 3/2001 Chiang ................. G06T 3/4015
345/603
10,147,770 B2 * 12/2018 Zhang ................. H01L 27/3216
(Continued)

FOREIGN PATENT DOCUMENTS

WO      2014/197252 A2    12/2014
WO      2016/150117 A1     9/2016

OTHER PUBLICATIONS

PCT International Search Report and Written Opinion of the International Searching Authority dated Jan. 10, 2018, Application No. PCT/EP2017/073908, Applicant Vestel Elektronik Sanayi Ve Ticaret A. S., 15 Pages.
(Continued)

*Primary Examiner* — Bryan Earles
(74) *Attorney, Agent, or Firm* — Brooks Kushman P.C.

(57) ABSTRACT

The present invention provides a display device for displaying color image data, the display device comprising a plurality of first dedicated pixels comprising a square shape, and a plurality of second dedicated pixels comprising a rectangular shape, wherein the first dedicated pixels and the second dedicated pixels are arranged interlaced to form a display surface, and wherein each first dedicated pixel and each second dedicated pixel comprises exactly three light sources of different colors. Further, the present invention provides a respective assembly method.

12 Claims, 9 Drawing Sheets

(56) References Cited

U.S. PATENT DOCUMENTS

| | | | |
|---|---|---|---|
| 10,163,985 B2* | 12/2018 | Hwang | G09G 3/20 |
| 2008/0225143 A1* | 9/2008 | Joffer | G09F 9/3026 |
| | | | 348/280 |
| 2016/0322433 A1* | 11/2016 | Kim | H01L 27/3216 |
| 2017/0004751 A1* | 1/2017 | Seo | G09G 3/3233 |
| 2019/0181191 A1* | 6/2019 | Chen | H01L 27/3216 |
| 2019/0333434 A1* | 10/2019 | Chen | G09G 3/2003 |

OTHER PUBLICATIONS

PCT Written Opinion of the International Preliminary Examining Authority dated Oct. 1, 2018, Application No. PCT/EP2017/073908, Applicant Vestel Elektronik Sanayi Ve Ticaret A.S., 10 Pages.

PCT International Preliminary Report on Patentability dated Apr. 9, 2019, Application No. PCT/EP2017/073908, Applicant Vestel Elektronik Sanayi Ve Ticaret A.S., 47 Pages.

* cited by examiner

METHOD FOR A DISPLAY DEVICE

CROSS-REFERENCE TO RELATED APPLICATION

This application is the U.S. national phase of PCT Application No. PCT/EP2017/073908 filed on Sep. 21, 2017, which claims priority to European Patent Application No. EP 16206859.7 filed on Dec. 28, 2016, the disclosures of which are incorporated in their entireties by reference herein.

TECHNICAL FIELD

The disclosure relates to a display device and manufacturing method for a display device

BACKGROUND

Although applicable to any system that uses single light sources such as microLED (µLED) displays to display image data, the display device and method of the present disclosure will be described in combination with LED displays that use RGB LEDs to display image data, and more specifically in combination with inorganic RGB SMD LED displays.

LED displays may use single color DIP LEDs or RGB LEDs to form a single pixel and a plurality of pixels to display an image. With this arrangement the resolution of the display is limited by the size of the single color LEDs.

There exist displays that use discrete through-hole or SMD LEDs in different color to provide a pixel. Usually one pixel will be built up of one discrete red LED, one discrete green LED and one discrete blue LED. Such pixels may be called 1R1G1B pixels.

However, to increase the resolution of LED displays, the technique of virtual pixels has been introduced, where one virtual pixel is formed of two adjacent pixels. However, this technique can only be used with symmetrical pixels. The pixels for use with virtual pixels will therefore comprise two discrete red LEDs, one discrete green LED and one discrete blue LED. Such pixels may be called 2R1G1B pixel. However, such 2R1G1B pixel are non-standard pixels as compared to 1R1G1B pixels and need to be specifically produced. On a virtual pixel LED screen, the red, green and blue data taken from the four pixels of the image displayed are mapped to light the red, green and blue LEDs of the physical pixel on the screen. Therefore, theoretically the resolution will be four times, two time vertically and two time horizontally, the resolution of a real pixel technology LED display.

Accordingly, there is a need for providing high resolution displays with standard building blocks.

Document WO 2014/197 252 A2 discloses a display array that may include a plurality of multifunctional pixels. Each multifunctional pixel can include a red display area, a green display area, and a blue display area.

SUMMARY

The present disclosure provides a display device and a corresponding method.

Consequently, a display device for displaying color image data comprises a plurality of first dedicated pixels comprising a square shape, in a top view, i.e., viewed from the direction of main light emission of the pixel or the single light sources of the pixel, a plurality of second dedicated pixels comprising a rectangular shape, also in a top view, i.e., viewed from the direction of main light emission of the pixel or the single light sources of the pixel, wherein the first dedicated pixels and the second dedicated pixels are arranged interlaced to form a display surface, and wherein each first dedicated pixel and each second dedicated pixel comprises exactly three light sources of different colors.

Further, an assembly method for a display device for displaying color image data comprises providing a plurality of first dedicated pixels comprising a square shape, and providing a plurality of second dedicated pixels comprising a rectangular shape, and arranging the first dedicated pixels and the second dedicated pixels interlaced to form a display surface, wherein each first dedicated pixel and each second dedicated pixel comprises exactly three light sources of different colors.

The display device of the present disclosure combines square shaped and rectangular shaped pixels of only three different colors. Every single pixel therefore only comprises three light sources. Such pixels are easy to manufacture and easy to interface, since e.g., only three signal lines and one common ground is needed per pixel. Alternatively one common input and three switched ground connections can be provided.

Common display controllers use virtual pixels to increase the resolution of a display. However, these virtual pixel controllers require pixels that have two red light sources, so called 2R1G1B light sources.

However, the interlaced arrangement of the single pixels in the present disclosure allows forming virtual pixels using at least two light sources of different colors of at least one first dedicated pixel and one light source of another color of at least one second dedicated pixel. Embodiments of the present disclosure therefore do neither need two red light sources nor any complex interpolation algorithms to increase the resolution of the display but can be used with virtual pixel algorithms that require less computing power than interpolation algorithms.

Known LED displays with all rectangular or all square package RGB LEDs are not efficient at fine pitch applications. For example with LED sizes of 1.2 mm×1.2 mm and pitch sizes smaller than 2 mm virtual pixels cannot be efficiently used. The same applies for LEDs of size 0.6 mm×0.6 mm and a pitch size smaller than 1 mm solution. In general the present patent application is especially useful if the LED sizes are smaller than 1 mm and the pitch size is smaller than three times the RGB LED size. However, the present patent application can be use with any other size of LEDs.

Therefore, the present disclosure further allows increasing the resolution of a display device with three colored light sources per pixel, without the need to add a fourth light source to each pixel.

Further embodiments of the present disclosure are subject of the further subclaims and of the following description, referring to the drawings.

In another embodiment, each first dedicated pixel and each second dedicated pixel can comprise one red light source and one green light source and one blue light source. Using red, green and blue, also called RGB in this context, as colors of the light sources allows using standard colors that can be combined with any type of display controller without requiring any amendments on the side of the display controller. Such a display controller can e.g., be comprised in the display device and comprise algorithms to control the single dedicated pixels according to received image data. Further, such a display controller can also be configured to control virtual pixels in the display device. In order to control virtual pixels in the display device, the controller can use single color light sources of adjacent dedicated pixels to form a new virtual pixel comprising one light source of every color or more, e.g., one or two red light sources and one green light source and one blue light source.

In another embodiment, the first dedicated pixels and the second dedicated pixels can comprise integrated surface mount light emitting diodes with three light sources, e.g., SMD LEDs with single red, green and blue colored diodes in one SMD housing, or three discrete light emitting diodes, e.g., each with a different color, e.g., red, green and blue, wherein the discrete light emitting diodes comprise surface mounted devices, like SMD LEDs, or through-hole devices. The present disclosure can be used with any type of three color LED arrangement, especially RGB arrangements. SMD RGB LEDs will provide very compact pixels and therefore allow for a very fine pitch and a tight assembly. The term pitch in this context refers to the distance between two single pixels.

In another embodiment, two of the first dedicated pixels vertically positioned adjacent to or on top of each other can have the height of one vertically positioned second dedicated pixel. Further, in the interlaced arrangement two of the first dedicated pixels vertically positioned adjacent to each other can be horizontally arranged next to one vertically positioned second dedicated pixel. In another embodiment, the pitch between the first dedicated pixels and/or the second dedicated pixels arranged next to each other can be smaller than five times or four times or three times the edge size of the respective first dedicated pixels and/or second dedicated pixels. Two of the first dedicated pixels stacked on top of each other can be as high as a single second dedicated pixel. That means that two vertically stacked first dedicated pixels and one second dedicated pixel next to each other can form a rectangular arrangement of three pixels. These can then flexibly be arranged to build up the complete surface of the display device.

In another embodiment, the display device can comprise line-wise arrangements of the first dedicated pixels and the second dedicated pixels. In the line wise arrangements the pixels can be arranged e.g., with the above mentioned rectangular arrangement of three pixels. The lines can be horizontal or vertical lines.

In another embodiment, all the lines can start with two of the first dedicated pixels vertically positioned adjacent to each other or with one of the second dedicated pixels. This arrangement provides far identical line arrangements of the first and second dedicated pixels. Therefore, easy manufacturing of the display device is possible.

In another embodiment, the lines can alternatingly start with two of the first dedicated pixels vertically positioned adjacent to each other or one of the second dedicated pixels. This arrangement provides slightly shifted pixels from one line to the next and therefore provides a smoothed image.

In another embodiment, the first dedicated pixels can comprise an edge length of 50 micrometers to 5 millimeters, especially 100 micrometers to 3 millimeters, and more especially 600 micrometers. In addition or as alternative, the second dedicated pixels can comprise a vertical edge length of 10 micrometers to 10 millimeters, especially 20 micrometers to 6 millimeters, and more especially 1 millimeter. Further as an alternative or in addition, the second dedicated pixels can comprise a horizontal edge length of 10 micrometers to 10 millimeters, especially 30 micrometers to 3 millimeters, and more especially 300 micrometers. The present disclosure can especially be used with very fine pitch and in very tight assemblies. In contrast systems in the prior art can only use SMD RGB LEDs with virtual pixels, and sometimes only with complex interpolations, if the pitch size is much greater than the LED size.

In another embodiment, in the first dedicated pixels the three light sources can be arranged in a triangle shape, e.g., with one light source being arranged on each one of the corners of the triangle. In addition or as alternative in the second dedicated pixels the three light sources can be arranged in a line arrangement, e.g., a horizontal line or a vertical line.

It is understood that the orientation of the triangle or the line can vary from application to application. For example a tip of the triangle can be positioned in the top center position or the triangle can be rotated in any angle from this position. The same applies to the line arrangement. The three light sources can e.g., be positioned on a vertical line, a horizontal line or a rotated line with any rotation angle.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the enclosed drawings, in which.

In the figures like reference signs denote like elements unless stated otherwise.

DETAILED DESCRIPTION

Figure 1:
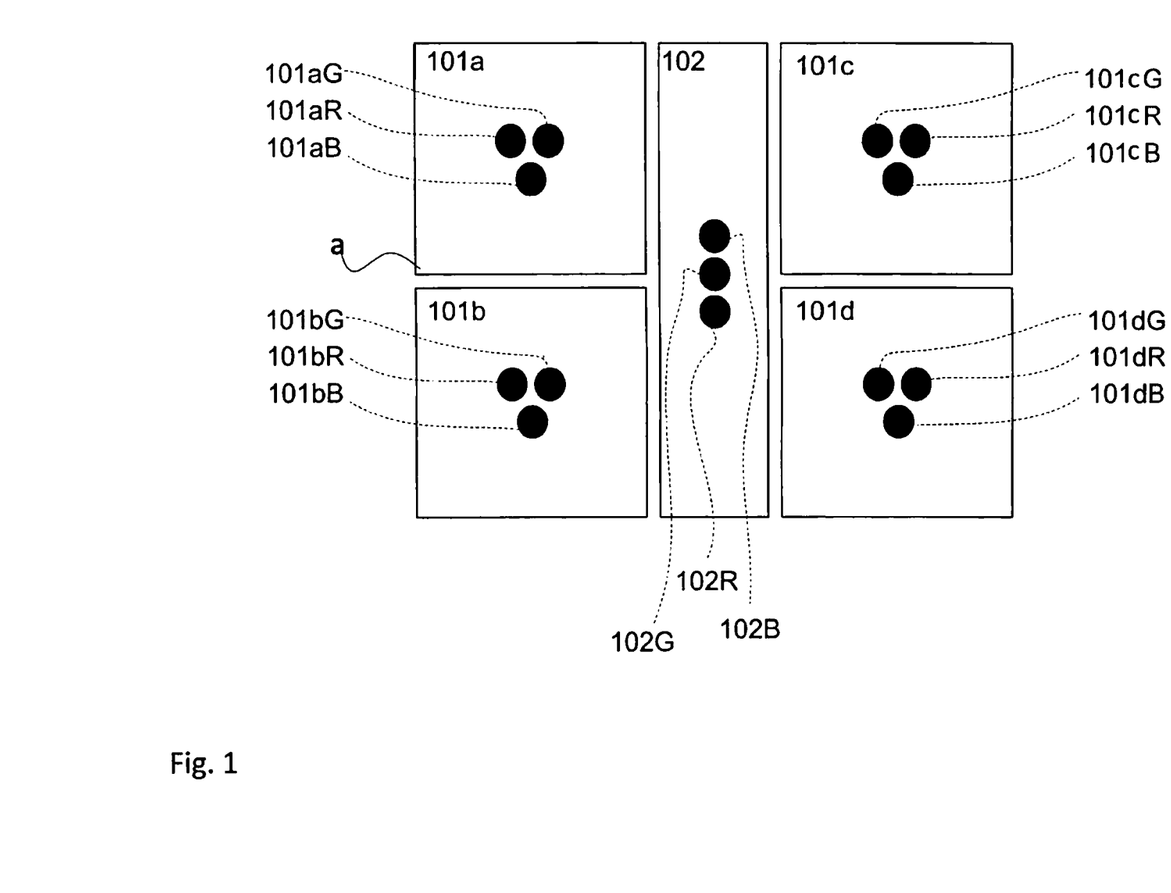
FIG. 1 shows a schematic diagram of first and second dedicated pixels according to an embodiment of the present disclosure.

FIG. 1 shows a schematic diagram of first dedicated pixels 101*a*, 101*b*, 101*c*, 101*d* and a second dedicated pixel 102.

The first dedicated pixels 101*a*, 101*b*, 101*c*, 101*d* comprise a square shape with equally length sides. The second dedicated pixel 102 comprises a rectangular shape, wherein the vertical side of the rectangular shape is as long as twice the length of a side of the first dedicated pixels 101*a*, 101*b*, 101*c*, 101*d* plus a margin. The margin may be the distance a between two of the first dedicated pixels 101*a*, 101*b*, 101*c*, 101*d*.

FIG. 1 shows four first dedicated pixels 101a, 101b, 101c, 101d and one second dedicated pixel 102. The four first dedicated pixels 101a, 101b, 101c, 101d are arranged in two columns, with two of the first dedicated pixels 101a, 101b, 101c, 101d in each column. Between the two columns is vertically arranged the second dedicated pixel 102.

In the arrangement of FIG. 1 every first dedicated pixel 101a, 101b, 101c, 101d and the second dedicated pixel 102 comprises three light sources, for example LEDs, of different colors. The first dedicated pixels 101a, 101b, 101c, 101d each comprise a red light source 101aR, 101bR, 101cR, 101dR, one green light source 101aG, 101bG, 101cG, 101dG, and one blue light source 101aB, 101bB, 101cB, 101dB. In the first dedicated pixels 101a, 101b, 101c, 101d the light sources 101aR, 101bR, 101cR, 101dR, 101aG, 101bG, 101cG, 101dG, 101aB, 101bB, 101cB, 101dB are arranged in a rectangular shape, i.e., the red light source 101aR, 101bR, 101cR, 101cR, 101dR, the green light source 101aG, 101bG, 101cG, 101dG, and the blue light source 101aB, 101bB, 101cB, 101dB are positioned each on a corner of the triangle, wherein a tip of the triangle is pointed downwards.

The second dedicated pixel 102 also comprises three light sources, e.g., LEDs, one red light source 102R, one green light source 102G, and one blue light source 102B, which are arranged on a vertical line from bottom to top.

In the two first dedicated pixels 101a, 101b of the left column, the green light source 101aG, 101bG is arranged on the top right corner of the triangle, the red light source 101aR, 101bR is arranged on the top left corner of the triangle, and the blue light source 101aB, 101bB is arranged on the lower corner of the triangle.

In the two first dedicated pixels 101c, 101d of the right column, the green light source 101cG, 101dG is arranged on the top left corner of the triangle, the red light source 101cR, 101dR is arranged on the top right corner of the triangle, and the blue light source 101cB, 101dB is arranged on the lower corner of the triangle.

It is understood, that the above described arrangement of single light sources 101aR, 101bR, 101cR, 101dR, 101aG, 101bG, 101cG, 101dG, 101aB, 101bB, 101cB, 101dB, 102R, 102G, 102B in the first dedicated pixels 101a, 101b, 101c, 101d and the second dedicated pixel 102 is just exemplary and other arrangements can also be used.

The arrangement of the first dedicated pixels 101a, 101b, 101c, 101d and the second dedicated pixel 102 of FIG. 1 allows providing a plurality of virtual pixels in addition to the presented first dedicated pixels 101a, 101b, 101c, 101d and second dedicated pixel 102.

Figure 2:
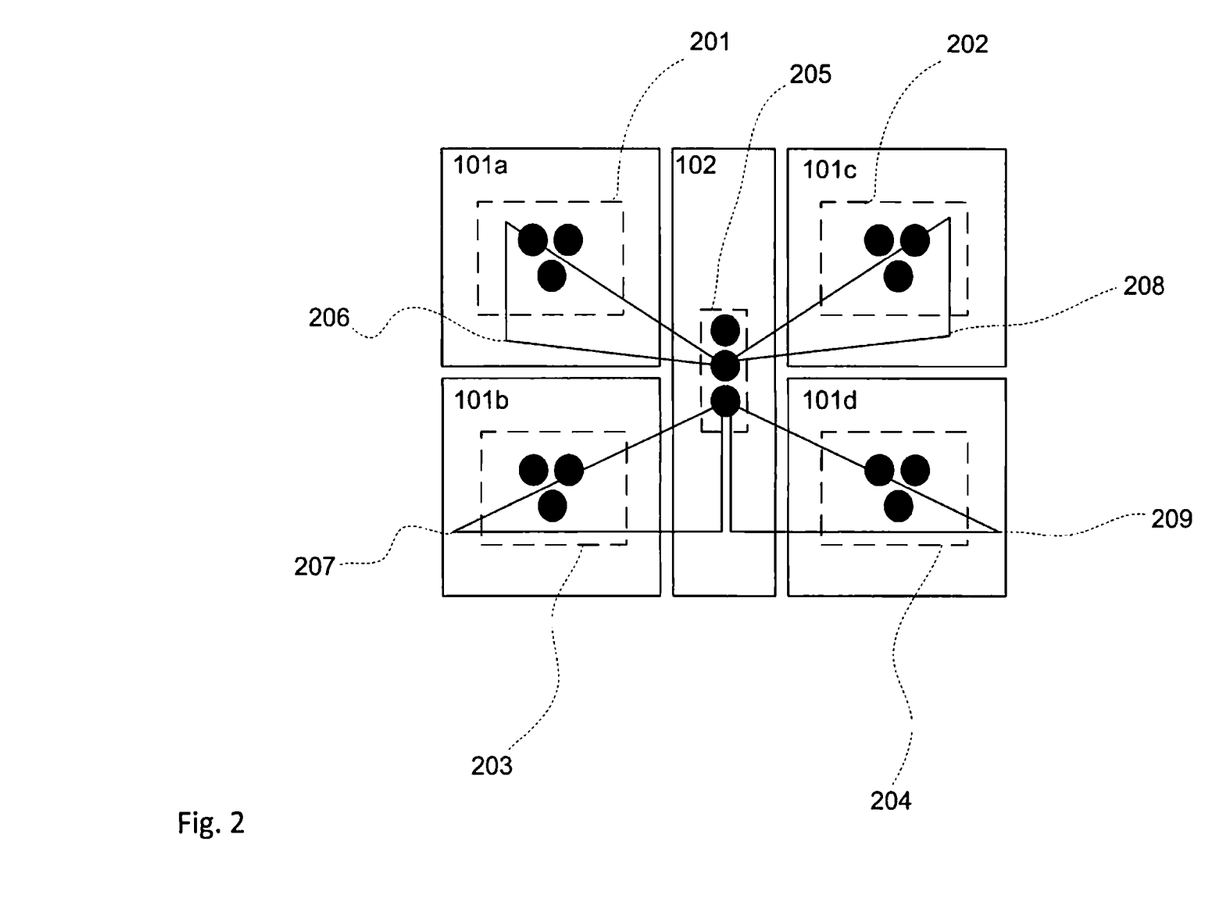
FIG. 2 shows another schematic diagram of first and second dedicated pixels according to an embodiment of the present disclosure.

FIG. 2 therefore shows the same arrangement of pixels 101a, 101b, 101c, 101d, 102 as shown in FIG. 1. The reference signs of the single light sources 101aR, 101bR, 101cR, 101dR, 101aG, 101bG, 101cG, 101dG, 101aB, 101bB, 101cB, 101dB, 102R, 102G, 102B have been omitted for sake of clarity, however the reference signs of FIG. 1 apply.

In FIG. 2, the possible combinations of light sources 101aR, 101bR, 101cR, 101dR, 101aG, 101bG, 101cG, 101dG, 101aB, 101bB, 101cB, 101dB, 102R, 102G, 102B to form a pixel of the displayed image are each shown by a line delineating their respective circumference. Real pixels 201, 202, 203, 204, 205 are each formed by the three light sources 101aR, 101bR, 101cR, 101dR, 101aG, 101bG, 101cG, 101dG, 101aB, 101bB, 101cB, 101dB, 102R, 102G, 102E of the respective dedicated pixel 101a, 101b, 101c, 101d, 102 shown by dashed lines.

The possible virtual pixels 206, 207, 208, 209 are shown by solid lines. The first virtual pixel 206 comprises the red light source 101aR and the blue light source 101aB of the top left first dedicated pixel 101a and the green light source 102G of the second dedicated pixel 102. The second virtual pixel 207 comprises the blue light source 101bB and the green light source 101bG of the lower left first dedicated pixel 101b and the red light source 102R of the second dedicated pixel 102. The third virtual pixel 208 comprises the red light source 101cR and the blue light source 101cB of the upper right first dedicated pixel 101c and the green light source 102G of the second dedicated pixel 102. The fourth virtual pixel 209 comprises the blue light source 101dB and the green light source 101dG of the lower right first dedicated pixel 101d and the red light source 102G of the second dedicated pixel 102.

The shown arrangement of first dedicated pixels 101a, 101b, 101c, 101d and the second dedicated pixel 102 therefore allows providing a total of 9 pixels out of five real or dedicated pixels 101a, 101b, 101c, 101d, 102, therefore almost doubling the resolution of the display.

Alternative arrangements are also possible. The virtual pixels can e.g., use all three light sources of the respective first dedicated pixel 101a, 101b, 101c, 101d and only the red light source 102R of the second dedicated pixel 102.

The first dedicated pixels 101a, 101b, 101c, 101d can e.g., comprise an edge length of 50 micrometers to 5 millimeters, especially 100 micrometers to 3 millimeters, and more especially 600 micrometers. The second dedicated pixels 102 can comprise a vertical edge length of 10 micrometers to 10 millimeters, especially 20 micrometers to 6 millimeters, and more especially 1 millimeter. Further the second dedicated pixels 102 can comprise a horizontal edge length of 10 micrometers to 10 millimeters, especially 30 micrometers to 3 millimeters, and more especially 300 micrometers.

Figure 3:
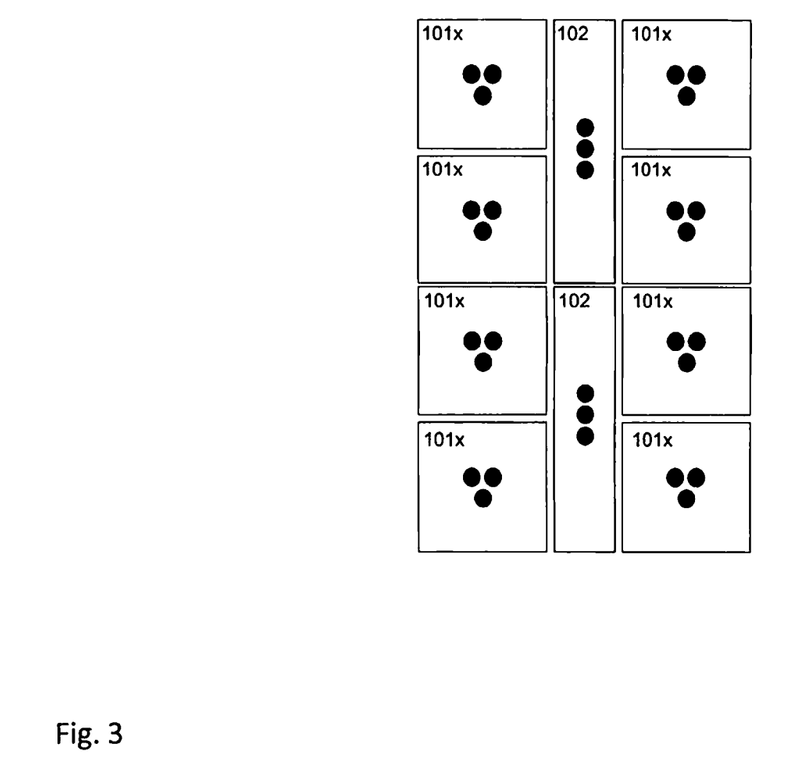
FIG. 3 shows another schematic diagram of first and second dedicated pixels according to an embodiment of the present disclosure.

FIG. 3 shows another schematic diagram of first dedicated pixels 101x and second dedicated pixels 102. Since the dedicated pixels 101x may be identical the same reference sign is used for all first dedicated pixels 101x. The same applies to the two second dedicated pixels 102. However, the pixels with different or rotated arrangements of the light sources 101aR, 101bR, 101cR, 101dR, 101aG, 101bG, 101cG, 101dG, 101aB, 101bB, 101cB, 101dB, 102R, 102G, 102B of FIG. 1 may also be used.

In FIG. 3 the arrangement of FIGS. 1 and 2 is doubled, i.e., provided twice, and the two arrangements are provided one vertically over the other. The configuration shown in FIG. 3 can e.g., be used to form a complete panel for a display, as e.g., shown in FIG. 5.

Figure 4:
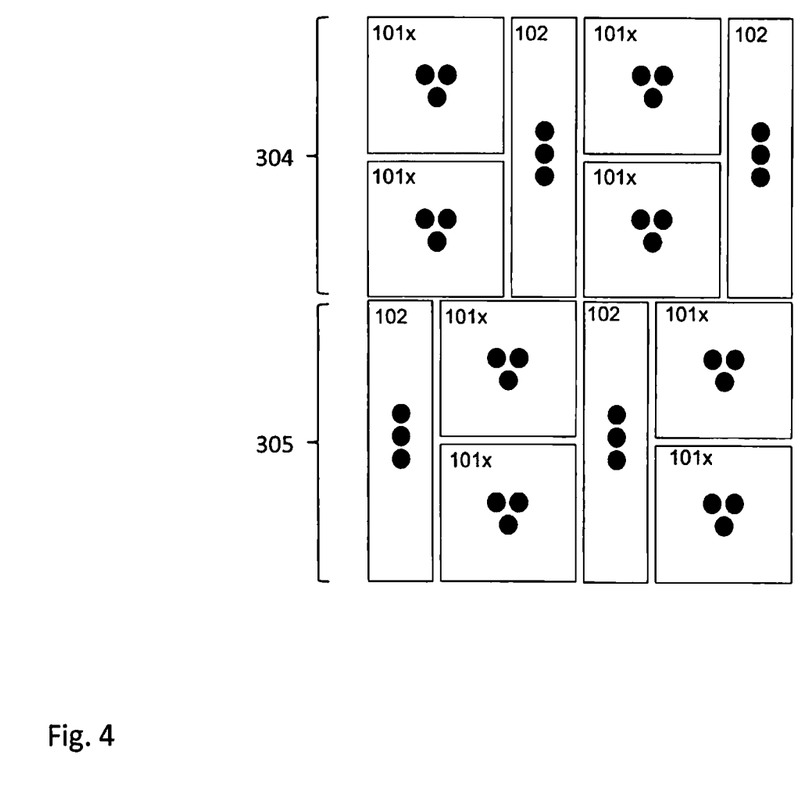
FIG. 4 shows another schematic diagram of first and second dedicated pixels according to an embodiment of the present disclosure.

FIG. 4 shows another schematic diagram of first dedicated pixels 101x and second dedicated pixels 102. Since the dedicated pixels 101x may be identical the same reference sign is used for all first dedicated pixels 101x. The same applies to the two second dedicated pixels 102. However, the pixels with different or rotated arrangements of the light sources 101aR, 101bR, 101cR, 101dR, 101aG, 101bG, 101cG, 101dG, 101aB, 101bB, 101cB, 101dB, 102R, 102G, 102B of FIG. 1 may also be used.

In the arrangement of FIG. 4 the first dedicated pixels 101x and the second dedicated pixels 102 are shifted between a first line 304 or row and a second 305 line or row. The first line 304 starts with the arrangement shown in FIGS. 1 and 2 and comprises a further second dedicated pixel 102 at the end. The second line 305 in contrast starts with a second dedicated pixel 102 and then comprises the arrangement of FIGS. 1 and 2 next to the second dedicated pixel 102. This means the second line 305 is shifted by the width of a second dedicated pixel 102 in contrast to the first line 304. The configuration shown in FIG. 4 can e.g. be used to form a complete panel for a display, as e.g., shown in FIG. 6.

Figure 5:
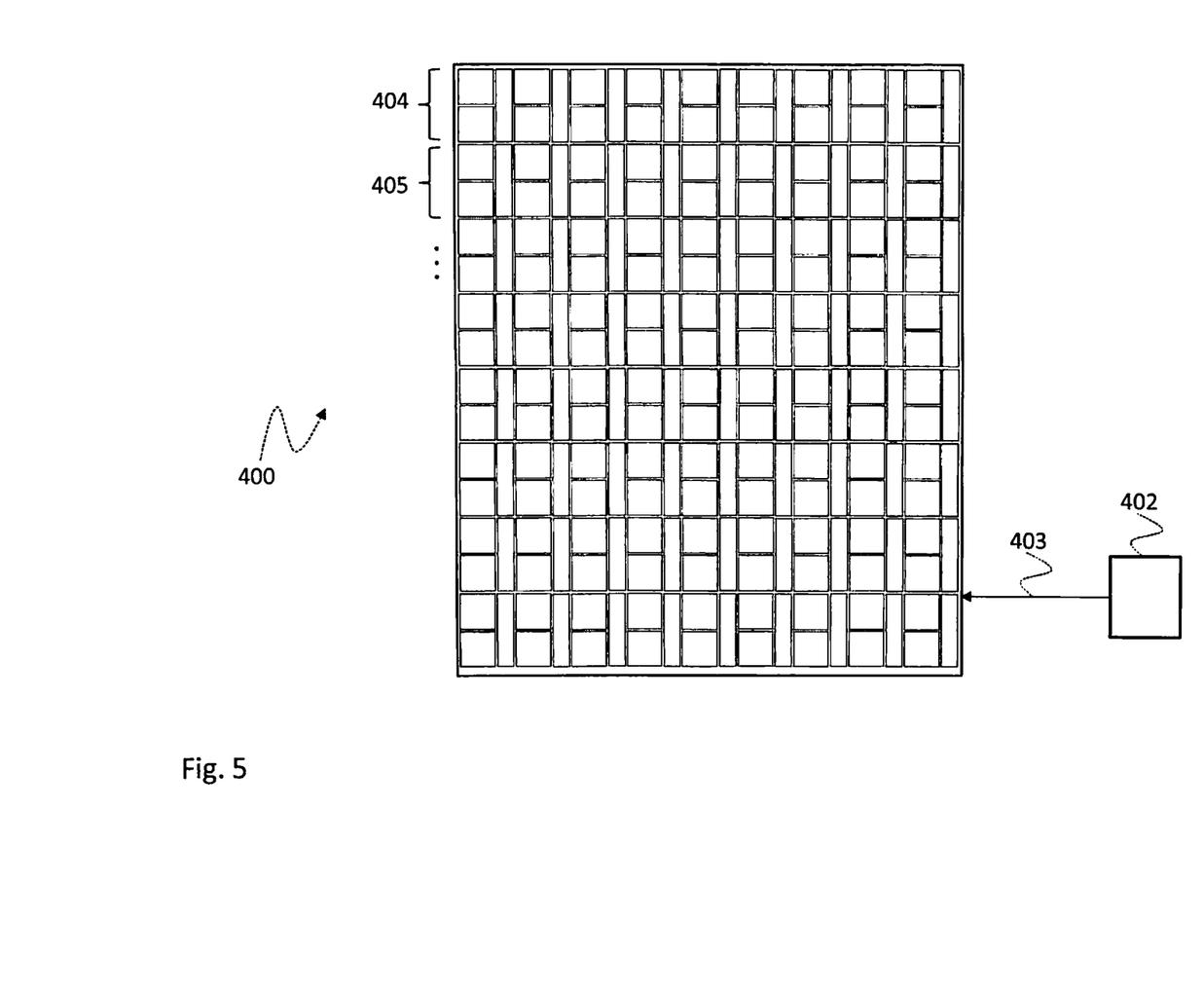
FIG. 5 shows a schematic diagram of an embodiment of a display device according to the present disclosure.

FIG. 5 shows a schematic diagram of a display device 400. The display device 400 comprises a plurality of lines 404, 405 (more indicated by three dots). A controller 402 is provided to control the single pixels, dedicated and virtual, of the display 400 and provides according color image data 403.

In the display device 400 every line 404, 405 comprises the same arrangement of pixels, as e.g., shown in FIG. 3. That means that the first dedicated pixels and the second dedicated pixels are arranged in the same position in every line 404, 405 of the display device 400, e.g., in vertical lines.

Figure 6:
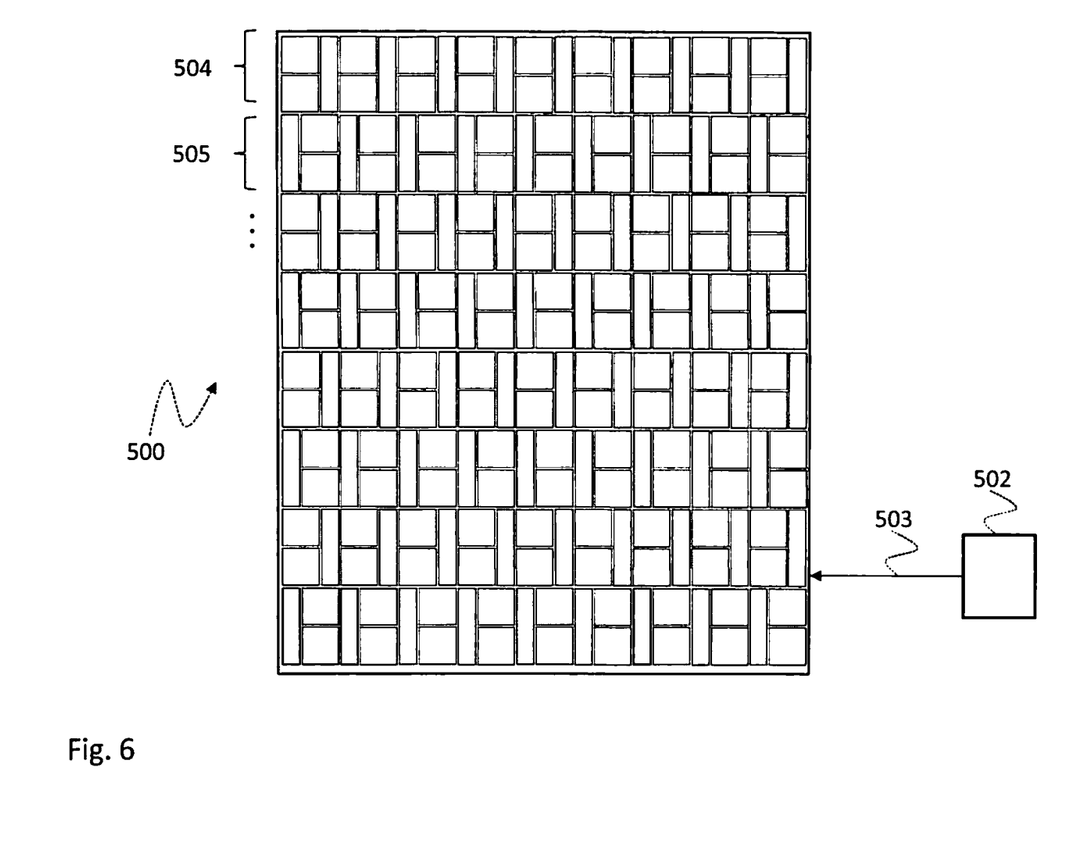
FIG. 6 shows a schematic diagram of another embodiment of a display device according to the present disclosure.

FIG. 6 shows an alternative schematic diagram of a display device 500. In contrast to the display device 400 in the display device 500 the lines alternatingly start either with two first dedicated pixels 101x or with a second dedicated pixel 102, as e.g., shown in FIG. 4.

It is understood, that in the display device 400 and the display device 500 the arrangements of FIGS. 3 and 4 can also be used vertically instead of horizontally, i.e., rotated about 90°. The display device 400 and the display device 500 would then instead of lines comprise columns.

Figure 7:
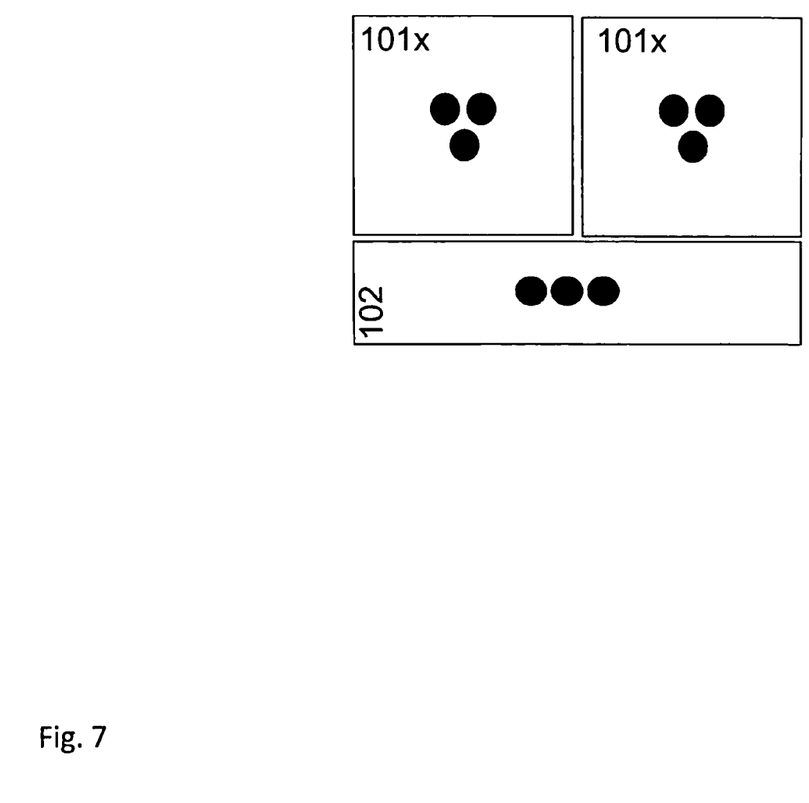
FIG. 7 shows another schematic diagram of first and second dedicated pixels according to an embodiment of the present disclosure.

FIG. 7 shows another schematic diagram of first dedicated pixels 101x and a second dedicated pixel 102.

In FIG. 7 two first dedicated pixels 101x are provided horizontally next to each other, again with a small distance in between. The second dedicated pixel 102 is horizontally positioned below the two first dedicated pixels 101x.

The arrangement in FIG. 7 is an alternative arrangement to the arrangement of FIGS. 1 and 2 and can be used in applications, where a rotation of the dedicated pixels 101x, 102 may be beneficial.

Figure 8:
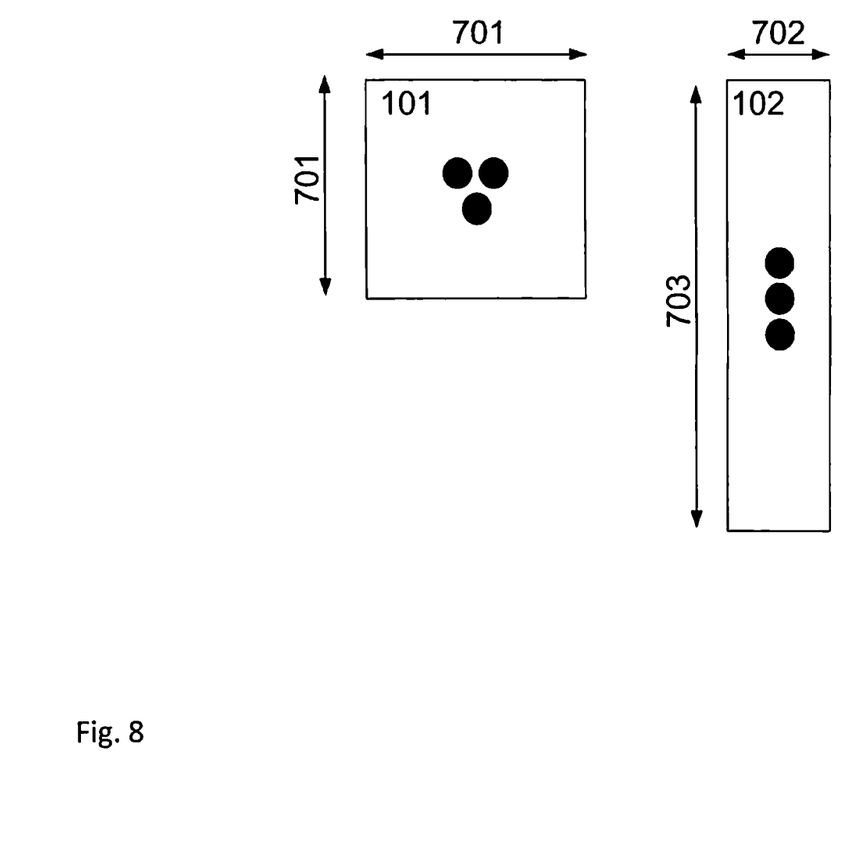
FIG. 8 shows another schematic diagram of first and second dedicated pixels according to an embodiment of the present disclosure.

FIG. 8 shows another schematic diagram of a first dedicated pixel 101 and a second dedicated pixel 102. The first dedicated pixel is square shaped and has a predetermined edge length 701. The second dedicated pixel 102 is rectangular shaped and has a horizontal edge length 702 and a vertical edge length 703.

The edge length 701 of the first dedicated pixel 101 is approximately half the length of the vertical edge length 703 of the second dedicated pixel 702 and double the length of the horizontal edge length 702 of the second dedicated pixel 702.

In general, the first dedicated pixel 101 may have an edge length 701 of 50 micrometers to 5 millimeters, especially 100 micrometers to 3 millimeters, and more especially 600 micrometers. The second dedicated pixel 102 may have a vertical edge length 703 of 10 micrometers to 10 millimeters, especially 20 micrometers to 6 millimeters, and more especially 1 millimeter, and a horizontal edge length 703 of 10 micrometers to 10 millimeters, especially 30 micrometers to 3 millimeters, and more especially 300 micrometers.

Figure 9:
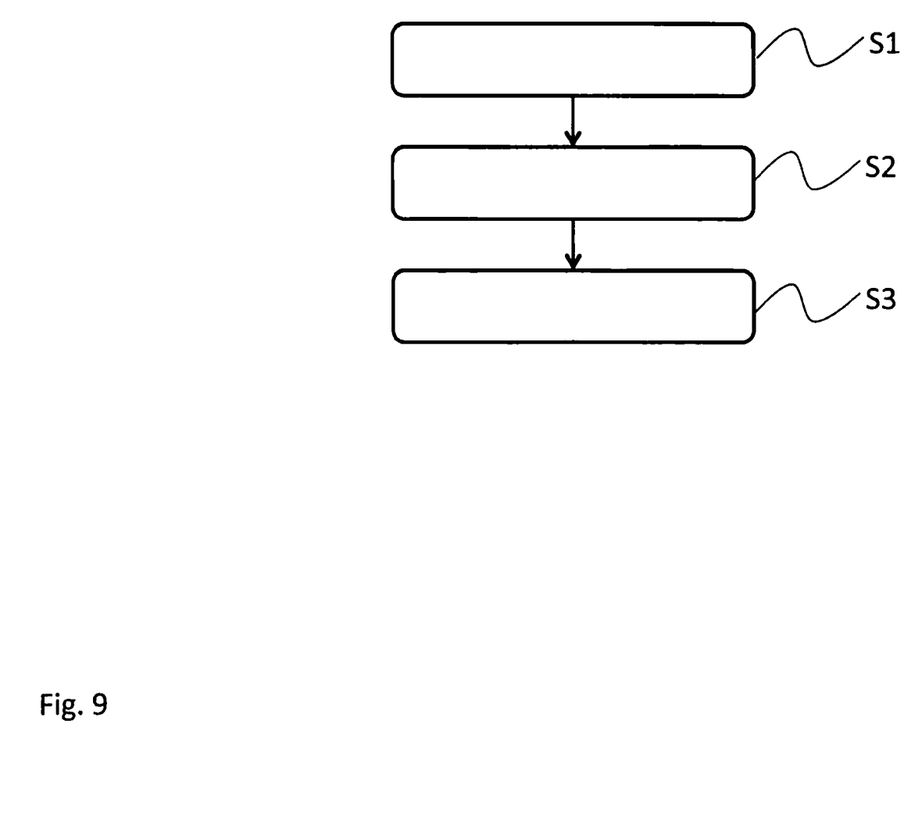
FIG. 9 shows a flow diagram of an embodiment of an assembly method according to the present disclosure.

FIG. 9 shows a flow diagram of an embodiment of an assembly method for a display device 400, 500 for displaying color image data 403, 503. For ease of understanding, the reference signs used in conjunction with FIGS. 1-6 will be used in the description of FIG. 9.

The assembly method comprises providing S1 a plurality of first dedicated pixels 101a, 101b, 101c, 101d, 101x comprising a square shape, and providing S2 a plurality of second dedicated pixels 102 comprising a rectangular shape.

Further, the first dedicated pixels 101a, 101b, 101c, 101d, 101x and the second dedicated pixels 102 are arranged S3 interlaced to form a display surface, wherein each first dedicated pixel 101a, 101b, 101c, 101d, 101x and each second dedicated pixel 102 comprises exactly three light sources of different colors.

The assembly method can further comprise providing each first dedicated pixel 101a, 101b, 101c, 101d, 101x and each second dedicated pixel 102 with one red light source 101aR, 101bR, 101cR, 101dR 102R and one green light source 101aG, 101bG, 101cG, 101dG, 102G and one blue light source 101aB, 101bB, 101cB, 101dB, 102B. In addition or as an alternative the first dedicated pixels 101a, 101b, 101c, 101d, 101x and/or the second dedicated pixels 102 can be provided as integrated surface mount light emitting diodes, SMD-LEDs, with three light sources or as three discrete light emitting diodes, LEDs, wherein the discrete light emitting diodes comprise surface mounted devices, SMD, or through-hole devices.

Further, two of the first dedicated pixels 101a, 101b, 101c, 101d, 101x can, when vertically positioned adjacent to each other, have the height of one vertically positioned second dedicated pixel 102. Further, arranging may comprise positioning two of the first dedicated pixels 101a, 101b, 101c, 101d, 101x vertically positioned adjacent to each other horizontally next to one vertically positioned second dedicated pixel 102. Arranging may further comprise providing a pitch between the first dedicated pixels 101a, 101b, 101c, 101d, 101x and/or the second dedicated pixels 102 arranged next to each other that is smaller than five times or four times or three times the edge size of the respective first dedicated pixels 101a, 101b, 101c, 101d, 101x and/or second dedicated pixels 102.

Arranging may further comprise line-wise arranging the first dedicated pixels 101a, 101b, 101c, 101d, 101x and the second dedicated pixels 102, wherein all the lines 304, 305, 404, 405, 504, 505 may start with two of the first dedicated pixels 101a, 101b, 101c, 101d, 101x vertically positioned adjacent to each other or with one of the second dedicated pixels 102. Further the lines 304, 305, 404, 405, 504, 505 may alternatingly start with two of the first dedicated pixels 101a, 101b, 101c, 101d, 101x vertically positioned adjacent to each other and one of the second dedicated pixels 102.

In addition, providing may comprise providing the first dedicated pixels 101a, 101b, 101c, 101d, 101x with an edge length of 50 micrometers to 5 millimeters, especially 100 micrometers to 3 millimeters, and more especially 600 micrometers, and providing the second dedicated pixels 102 with a vertical edge length of 10 micrometers to 10 millimeters, especially 20 micrometers to 6 millimeters, and more especially 1 millimeter, and providing the second dedicated pixels 102 with a horizontal edge length of 10 micrometers to 10 millimeters, especially 30 micrometers to 3 millimeters, and more especially 300 micrometers.

The three light sources of the first dedicated pixels 101a, 101b, 101c, 101d, 101x may be provided arranged in a triangle shape. Further, the three light sources in the second dedicated pixels 102 may be arranged in a line arrangement.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

The present disclosure provides a display device (400, 500) for displaying color image data (403, 503), the display device (400, 500) comprising a plurality of first dedicated pixels (101*a*, 101*b*, 101*c*, 101*d*, 101*x*) comprising a square shape, and a plurality of second dedicated pixels (102) comprising a rectangular shape, wherein the first dedicated pixels (101*a*, 101*b*, 101*c*, 101*d*, 101*x*) and the second dedicated pixels (102) are arranged interlaced to form a display surface, and wherein each first dedicated pixel (101*a*, 101*b*, 101*c*, 101*d*, 101*x*) and each second dedicated pixel (102) comprises exactly three light sources of different colors. Further, the present disclosure provides a respective assembly method.

LIST OF REFERENCE SIGNS

- 400, 500 display device
- 101*a*, 101*b*, 101*c*, 101*d*, 101*x* first dedicated pixels
- 102 second dedicated pixels
- 101*a*R, 101*b*R, 101*c*R, 101*d*R, 102R red light source
- 101*a*G, 101*b*G, 101*c*G, 101*d*G, 102G green light source
- 101*a*B, 101*b*B, 101*c*B, 101*d*B, 102B blue light source
- 201, 202, 203, 204, 205 real pixel
- 206, 207, 208, 209 virtual pixel
- 304, 305 line
- 402, 502 controller
- 403, 503 color image data
- 404, 405 line
- 504, 505 line
- 701, 702, 703 edge length
- S1-S3 method steps

The invention claimed is:

1. A display device for displaying color image data, the display device comprising:
   a plurality of first dedicated pixels comprising a square shape with equal length sides; and
   a plurality of second dedicated pixels comprising a rectangular shape, wherein a vertical side of the rectangular shape is as long as twice the length of a side of the first dedicated pixels plus a margin, the margin comprising a distance between two of the first dedicated pixels;
   wherein the first dedicated pixels and the second dedicated pixels are arranged interlaced to form a display surface; and
   wherein each first dedicated pixel and each second dedicated pixel comprises one exclusive red light source and one exclusive green light source and one exclusive blue light source, wherein in the first dedicated pixels the three light sources are arranged as an equilateral triangle shape with a center of the equilateral triangle at a center of the square, and wherein in the second dedicated pixels the three light sources are arranged in a line arrangement with a center of the line corresponding to a central light source at a center of the rectangle, wherein the other two light sources are at an equal distance from the central light source.

2. The display device according to claim 1, wherein the first dedicated pixels and the second dedicated pixels comprise integrated surface mount light emitting diodes with three light sources or three discrete light emitting diodes, wherein the discrete light emitting diodes comprise surface mounted devices or through-hole devices.

3. The display device according to claim 1, wherein two of the first dedicated pixels vertically positioned adjacent to each other have a height of one vertically positioned second dedicated pixel, and wherein in the interlaced arrangement two of the first dedicated pixels vertically positioned adjacent to each other are horizontally arranged next to one vertically positioned second dedicated pixel; and
   wherein a pitch between the first dedicated pixels and/or the second dedicated pixels arranged next to each other is smaller than five times or four times or three times an edge size of the respective first dedicated pixels and/or second dedicated pixels.

4. The display device according to claim 1, comprising line-wise arrangements of the first dedicated pixels and the second dedicated pixels.

5. The display device according to claim 4, wherein all the lines start with two of the first dedicated pixels vertically positioned adjacent to each other or wherein all the lines start with one of the second dedicated pixels.

6. The display device according to claim 4, wherein the lines alternatingly start with two of the first dedicated pixels vertically positioned adjacent to each other or one of the second dedicated pixels.

7. The display device according to claim 1, wherein the first dedicated pixels comprise an edge length of 50 micrometers to 5 millimeters, especially 100 micrometers to 3 millimeters, and more especially 600 micrometers;
   wherein the second dedicated pixels comprise a vertical edge length of 10 micrometers to 10 millimeters, especially 20 micrometers to 6 millimeters, and more especially 1 millimeter; and
   wherein the second dedicated pixels comprise a horizontal edge length of 10 micrometers to 10 millimeters, especially 30 micrometers to 3 millimeters, and more especially 300 micrometers.

8. An assembly method for a display device for displaying color image data, the assembly method comprising:
   providing a plurality of first dedicated pixels comprising a square shape with equal length sides;
   providing a plurality of second dedicated pixels comprising a rectangular shape, wherein a vertical side of the rectangular shape is as long as twice a length of a side of the first dedicated pixels plus a margin, the margin comprising a distance between two of the first dedicated pixels;
   arranging the first dedicated pixels and the second dedicated pixels interlaced to form a display suffice;
   providing each first dedicated pixel and each second dedicated pixel with one exclusive red light source and one exclusive green light source and one exclusive blue light source, wherein the three light sources of the first dedicated pixels are arranged as an equilateral triangle shape with a center of the equilateral triangle at a center of the square, and wherein the three light sources in the second dedicated pixels are arranged in a line arrangement with a center of the line corresponding to a central light source at a center of the rectangle, wherein the other two light sources are at an equal distance from the central light source.

9. The assembly method according to claim 8 further comprising providing the first dedicated pixels and/or the second dedicated pixels as integrated surface mount light emitting diodes with three light sources or as three discrete light emitting diodes, wherein the discrete light emitting diodes comprise surface mounted devices or through-hole devices.

10. The assembly method according to claim 8, wherein two of the first dedicated pixels vertically positioned adjacent to each other have a height of one vertically positioned second dedicated pixel, and wherein arranging comprises positioning two of the first dedicated pixels vertically positioned adjacent to each other horizontally next to one vertically positioned second dedicated pixel, and wherein arranging comprises providing a pitch between the first dedicated pixels and/or the second dedicated pixels arranged next to each other that is smaller than five times or four times or three times an edge size of the respective first dedicated pixels and/or second dedicated pixels.

11. The assembly method according to claim 8, wherein arranging comprises line-wise arranging the first dedicated pixels and the second dedicated pixels, wherein all the lines start with two of the first dedicated pixels vertically positioned adjacent to each other or wherein all the lines start with one of the second dedicated pixels or wherein the lines alternatingly start with two of the first dedicated pixels vertically positioned adjacent to each other and one of the second dedicated pixels.

12. The assembly method according to claim 8, wherein providing comprises providing the first dedicated pixels with an edge length of 50 micrometers to 5 millimeters, especially 100 micrometers to 3 millimeters, and more especially 600 micrometers;

wherein providing comprises providing the second dedicated pixels with a vertical edge length of 10 micrometers to 10 millimeters, especially 20 micrometers to 6 millimeters, and more especially 1 millimeter; and wherein providing comprises providing the second dedicated pixels with a horizontal edge length of 10 micrometers to 10 millimeters, especially 30 micrometers to 3 millimeters, and more especially 300 micrometers.

\* \* \* \* \*

UNITED STATES PATENT AND TRADEMARK OFFICE
CERTIFICATE OF CORRECTION

PATENT NO. : 10,867,545 B2
APPLICATION NO. : 16/474947
DATED : December 15, 2020
INVENTOR(S) : Barbaros Kirisken et al.

Page 1 of 1

It is certified that error appears in the above-identified patent and that said Letters Patent is hereby corrected as shown below:

In the Claims

Column 10, Line 48, Claim 8:
After "interlaced to form a display"
Delete "suffice" and
Insert -- surface --.

Signed and Sealed this
First Day of June, 2021

Drew Hirshfeld
*Performing the Functions and Duties of the
Under Secretary of Commerce for Intellectual Property and
Director of the United States Patent and Trademark Office*